(12) United States Patent
Cianfrocco et al.

(10) Patent No.: US 10,996,249 B2
(45) Date of Patent: *May 4, 2021

(54) SOFTWARE DEFINED BATTERY CHARGER SYSTEM AND METHOD

(71) Applicant: Johnson Controls Fire Protection LP, Boca Raton, FL (US)

(72) Inventors: Daniel P. Cianfrocco, Clinton, MA (US); Alexandre Gouin, Sainte Basile le Grand (CA)

(73) Assignee: Johnson Controls Fire Protection LP, Boca Raton, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/850,080

(22) Filed: Apr. 16, 2020

(65) Prior Publication Data

US 2020/0241056 A1 Jul. 30, 2020

Related U.S. Application Data

(63) Continuation of application No. 15/696,641, filed on Sep. 6, 2017, now Pat. No. 10,663,501.

(51) Int. Cl.
| | |
|---|---|
| *H02J 7/00* | (2006.01) |
| *G01R 22/00* | (2006.01) |
| *H02J 9/04* | (2006.01) |
| *H02J 9/06* | (2006.01) |
| *H02J 7/02* | (2016.01) |

(52) U.S. Cl.
CPC ............... *G01R 22/00* (2013.01); *H02J 7/00* (2013.01); *H02J 7/0071* (2020.01); *H02J 7/02* (2013.01); *H02J 7/022* (2013.01); *H02J 9/04* (2013.01); *H02J 9/061* (2013.01)

(58) Field of Classification Search
CPC ..................................................... H02J 7/0091
USPC .......................................................... 307/43
See application file for complete search history.

(56) References Cited

U.S. PATENT DOCUMENTS

| | | | |
|---|---|---|---|
| 2007/0217230 A1* | 9/2007 | Charles ............. | H02M 3/33507 363/20 |
| 2016/0134160 A1* | 5/2016 | Schultz ................. | H02J 7/0019 307/66 |
| 2016/0335867 A1* | 11/2016 | Palmer ................... | H02J 9/061 |

* cited by examiner

*Primary Examiner* — Edward Tso
*Assistant Examiner* — Ahmed H Omar
(74) *Attorney, Agent, or Firm* — HoustonHogle LLP

(57) ABSTRACT

A backup battery charging system for a building management system is disclosed. Components of the charging system include an analog power converter, a voltage feedback loop and a current feedback loop. The feedback loops each include at least one digital resistor. The system panel, in turn, includes at least one microcontroller that controls the building management system and also controls the charging system. The charging system is "software defined," in that the microcontroller controls the charging system by updating the digital resistors in the feedback loops to control the analog power converter. In one example, the building management system is a fire alarm system controlled by a fire control panel as the system panel.

17 Claims, 6 Drawing Sheets

| charging profile 54 | | | |
|---|---|---|---|
| Battery ID 102 | target voltage 122 | target current 132 | |
| | charging mode 104 | | |

| temperature compensation table 146 |||
|---|---|---|
| charging mode voltage 112 | Battery temperature (degrees C) 124 | temperature compensation voltage 126 |
| 12VDC/24VDC | 0 | +0.7VDC/+1.4VDC |
| 12VDC/24VDC | 0 < temp < 5 | +0.5VDC/+1.2VDC |
| 12VDC/24VDC | 5 <= temp < 10 | +0.3VDC/+1.0VDC |
| 12VDC/24VDC | 10 <= temp < 15 | 0.2VDC/+.7VDC |
| 12VDC/24VDC | 15 <= temp < 20 | 0.1VDC/+.3VDC |
| 12VDC/24VDC | 20 <= temp < 25 | 0.0VDC/0.0VDC |
| ⋮ | ⋮ | ⋮ |
| 12VDC/24VDC | 45 <= temp < 50 | -0.8VDC/-1.5VDC |

Fig. 2

SOFTWARE DEFINED BATTERY CHARGER SYSTEM AND METHOD

RELATED APPLICATIONS

This application is a Continuation of U.S. patent application Ser. No. 15/696,641, filed on Sep. 6, 2017, which is incorporated herein by reference in its entirety.

BACKGROUND OF THE INVENTION

Building management systems such as building automation systems, fire alarm systems and intrusion detection systems are often installed within premises such as in a commercial, residential, or government building. Examples of these buildings include offices, hospitals, warehouses, public infrastructure buildings including subways and bus terminals, multi unit dwellings, schools or universities, shopping malls, government offices, and casinos, to list a few examples.

Fire alarm systems typically include fire control panels that function as system controllers. Fire detection/signaling devices and alarm notification devices are then installed throughout the buildings and connected to the panels. Some examples of fire detection/signaling devices include smoke detectors, carbon monoxide detectors, flame detectors, temperature sensors, and/or pull stations (also known as manual call points). Some examples of fire notification devices include speakers, horns, bells, chimes, light emitting diode (LED) reader boards and message boards, and/or flashing lights (e.g., strobes).

During operation of the fire alarm systems, the fire detection devices monitor the buildings for indicators of fire. Upon detection of an indicator of fire such as smoke or heat or flames, the device is activated and a signal is sent from the activated device to the fire control panel. The fire control panel then initiates an alarm condition by activating audio and visible alarms of the fire notification devices of the fire alarm system. Additionally, the fire control panel will also send an alarm signal to a monitoring station, which will notify the local fire department or fire brigade.

Intrusion systems typically include intrusion panels and monitoring devices, where the monitoring devices detect indications of intrusions and unauthorized access at or within the building and report to the intrusion panel. The monitoring devices of the intrusion systems often include motion sensor devices, surveillance camera devices, and door controllers that communicate with the intrusion panel over a security network. Motion sensor devices can detect intrusions and unauthorized access to the premises, and send indications of the intrusions to the security panel. The surveillance camera devices capture video data of monitored areas within the premises, and door controllers provide access to perimeter and/or internal doors, in examples.

Building automation systems will typically include one or more building automation control panels and devices that control and monitor the physical plant aspects of a building and aspects of business-specific electrical, computer, and mechanical systems. The physical plant typically includes heating, ventilation, and air conditioning (HVAC) systems, elevators/escalators, lighting and power systems, refrigeration and coolant systems, and air and/or water purification systems, in examples. Business-specific systems include computer systems, manufacturing systems that include various types of computer-aided machinery and test equipment, and inventory control and tracking systems, in examples.

These building management systems often cannot rely upon the power grid as a sole source of input power. The systems typically employ a backup battery system that provides a source of backup power to panels in the event of failure or disruption of the power grid or the connection to the grid. These backup battery systems will also typically have a charging system for charging of the backup battery system.

SUMMARY OF THE INVENTION

The batteries in the battery backup systems often have extended battery standby requirements. The standby requirements are dictated by governmental safety standards and/or building codes. The batteries must also be subjected to mandatory annual battery capacity testing. Maximizing a battery's life requires a charging system that adjusts output voltage applied to the batteries in the backup battery system based on the state-of-charge as well as temperature, and that adjusts the output current based on battery size and chemistry, and possibly other requirements.

Major components of traditional charging systems include an analog power converter, one or more feedback loops connected to the analog power converter, and a controller. The analog power converter provides an output current at an output voltage to charge the batteries of the backup battery systems. Feedback loops are control circuits that have some or all of its output fed back into its input. The feedback loops detect changes to the output, and can respond to changes in the output that fall below and/or exceed thresholds by adjusting the input. The controller is typically dedicated to controlling the charging system.

The charging systems typically provide the following base set of features. The charging systems provide both a float charge and a fast charge output voltage with temperature compensation, limit charging current proportional to battery size, support different battery chemistries, and limit charging voltage based on battery chemistry. The charging systems must also operate in a way that maximizes the life of the batteries. A set of operating parameters for configuring the power converter is built from these features.

Temperature compensation involves adjusting the output voltage that the charging system applies to the batteries based on the temperature of the batteries. Cold batteries require a higher charging voltage to source current into the batteries, while warmer batteries require a lower charging voltage for the same purpose. Optimally, temperature sensors located in the same space or enclosure as the batteries in the battery backup system measure the temperature of the batteries. The charging system can then adjust the output voltage applied to the batteries in response to the measured temperature.

The charging systems also limit charging current and charging voltage based upon battery size and battery chemistry, respectively, and support different battery chemistries. Batteries usually include a number of individual cells, where the size of the battery is typically determined by the number of cells. Example battery chemistries include lead-acid, nickel metal hydride, and lithium. The charging systems typically utilize charging profiles for each battery that set a maximum charging current and a charging voltage for each battery size and chemistry.

Maximizing a battery's life requires a charging system that adjusts its output voltage applied to the batteries. The charging system typically adjusts the output voltage based on the state-of-charge (percent charged) as well as temperature. When a battery is depleted and being recharged it will accept charge at a faster rate if the charging voltage is increased. This increased voltage can only be applied for a short time otherwise damage and reduced life would result. As a result chargers can be designed to have a 'fast' charging voltage during recharge and a lower 'float' voltage for extended shelf-life.

However, designing charging systems to provide the base set of features is complex and costly, prompting manufacturers to make design compromises to reduce complexity and/or cost. In one example, rather than setting the output current that is appropriate for each battery size, some charging systems provide only two output current levels, appropriate for "small" and "large" sizes of batteries. In another example, some charging systems use a single output voltage for both the fast charging and float charging modes. This can increase recharge cycle times and/or reduce battery life. Some charging systems require an operator to manually configure the output voltage for each battery chemistry, or support only one type of battery chemistry. Yet other systems make compromises with regards to temperature compensation, such as compensating for temperature only during fast charging mode or not compensating for temperature at all.

Some charging systems use a digital microcontroller as the controller, where the digital microcontroller is combined with a power converter in one integrated circuit (IC) module. Applications such as software peripherals can then submit all operating parameters for configuring the power converter to the module. This results in a tightly integrated design with a small bill of materials. However, these integrated circuit modules are highly specialized and expensive. Moreover, because the entire power converter is defined in software, it has many time-critical operations to perform. If the microcontroller is used for other purposes, the application will find it has fewer available resources and there may be timing conflicts between operating the power converter and performing other actions.

An inventive charging system, such as for a building management system, is proposed. Specifically, the charging system is under control of at least one microcontroller of the system panel, for example. The microcontroller of the system panel ("microcontroller"), for example, provides the functionality of the dedicated controller in traditional charging systems, in one example. As a result, the dedicated controller of the traditional charging system is no longer needed, which reduces charging system complexity and manufacturing cost.

The inventive system also includes a battery backup system that is charged by the charging system. The battery backup system provides a source of power for the system panel. The charging system charges the batteries in battery backup system via an analog power converter of the charging system. The analog power converter provides an output current and output voltage to the battery backup system under control of the microcontroller.

The microcontroller maintains charging profiles for the batteries in the battery backup system. The charging profiles define a charging mode (e.g. fast and/or float charging modes), a target voltage, and target current at the target voltage. The target voltage defines an output voltage and the target current defines a maximum output current for the analog power converter of the charging system to apply to the battery backup system. The value of the output voltage is based on the chemistry of the batteries, and the value of the output current is based upon a size of the batteries. The charging profiles also maintain a table of temperature compensation voltages for adjusting the output voltage. The table includes values of compensation voltages for different temperatures, in accordance with temperature compensation curves for each battery chemistry.

In general, according to one aspect, the invention features a battery backup system and a charging system, of a building management system having a system panel, for example. The charging system charges the battery backup system, and includes an analog power converter. The analog power converter preferably provides an output current at an output voltage to the backup battery system under control of a microcontroller.

In one example, the system panel is a fire control panel, and the fire control panel is included within a fire alarm system that operates as the building management system.

The microcontroller can additionally control a detection circuit including sensor devices, and can control a notification circuit including notification devices. The microcontroller can also monitor a power bus that provides a primary source of input power to the system panel, and can send notifications to a central station in response to receiving indications of fire from the fire sensor devices.

The microcontroller preferably stores one or more charging profiles for the charging system. The microcontroller applies the charging profiles to the backup battery system for charging the backup battery system. Typically, the charging profiles include a target voltage, a target current, and a temperature compensation table. The target current defines a maximum output current. The temperature compensation table, in contrast, provides a temperature compensation voltage based upon a temperature of batteries in the backup battery system.

Typically, the target voltage within each charging profile is based on chemistry of the batteries within the backup battery system, and the target current within each charging profile is based on a size of the batteries within the backup battery system.

The microcontroller can also control the output voltage by updating a register within an output voltage digital resistor of a voltage feedback loop of the charging system.

Additionally and/or alternatively, the microcontroller can receive a temperature measurement of the backup battery system, obtain a temperature compensation voltage based upon the measured temperature, and then update the register within the output voltage digital resistor based upon the temperature compensation voltage. The microcontroller preferably receives the temperature measurement from a temperature sensor located within the backup battery system.

Additionally and/or alternatively, the microcontroller can control the output current by updating a register within an output current digital resistor of a current feedback loop of the charging system.

In general, according to another aspect, the invention features a method for a building management system. The method comprises a system panel controlling the building management system, a backup battery system powering the system panel, and a charging system charging the backup battery system. The system panel includes at least one microcontroller, and the at least one microcontroller controls an analog power converter of the charging system to provide an output current at an output voltage to the backup battery system.

The charging system can also measure errors in the output voltage and/or outpit current, and correct the errors.

The at least one microcontroller can control the analog power converter of the charging system to provide the output current at the output voltage to the backup battery system. In one example, the at least one microcontroller can control the analog power converter by: receiving a temperature measurement of the backup battery system; obtaining a temperature compensation voltage based upon the measured temperature and a target voltage maintained by the microcontroller; and updating a register within an output voltage digital resistor of a voltage feedback loop of the charging system with a resistor setting. The resistor setting is preferably based upon the target voltage offset by the temperature compensation voltage.

In one implementation, the microcontroller obtains the temperature compensation voltage in response to the microcontroller executing a lookup of the measured temperature from a temperature compensation table maintained by the microcontroller.

Additionally and/or alternatively, the at least one microcontroller can control the analog power converter of the charging system to provide the output current at the output voltage to the backup battery system. The at least one microcontroller can control the analog power converter by: calculating a resistor setting based on a target current maintained by the microcontroller; and updating an output current digital resistor within a current feedback loop of the charging system with the resistor setting. The target current defines a maximum value for the output current.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 2 shows detail of a charging profile maintained by the microcontroller of the fire alarm panel in FIGS. 1A and 1B for a specific backup battery system;

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms of the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Figure 1A:
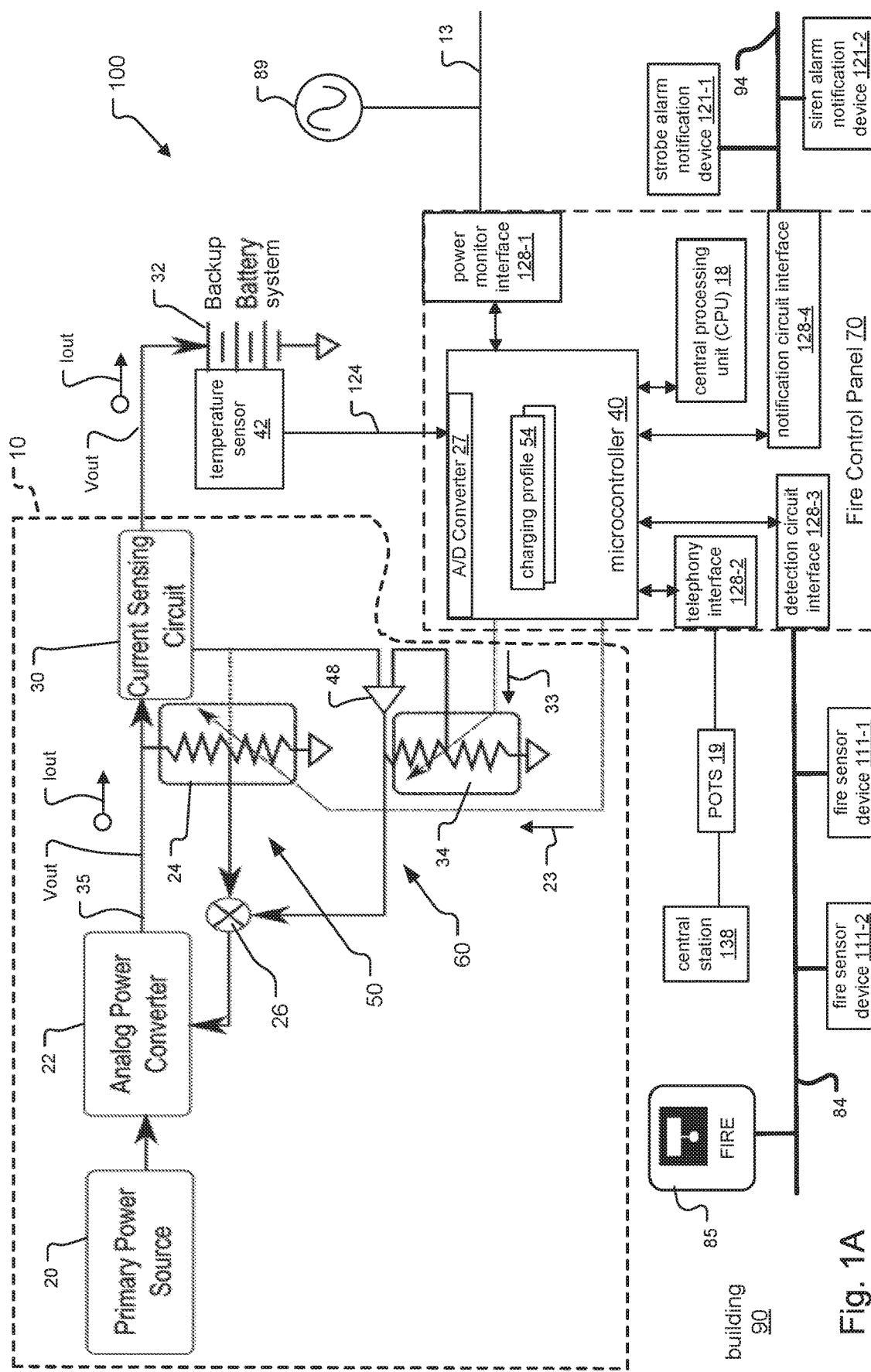
FIG. 1A shows an embodiment of a fire alarm system as an example of a building management system installed at a premises, where the fire alarm system is controlled by a fire alarm panel and includes a charging system for charging a backup battery system that provides power to the fire control panel, and where a microcontroller of the fire control panel controls the operation of the charging system.

FIG. 1A shows a fire alarm system 100. The fire alarm system 100 is an example of a building management system at a premises, such as a building 90. The fire alarm system 100 includes a charging system 10, a fire control panel 70, and a backup battery system 32. The charging system 10 charges the backup battery system 32, which in turn powers the panel 70. The backup battery system 32 provides a source of power to the panel 70 when a main source of AC power 89 to the panel 70 is disrupted or unavailable.

The panel 70 includes a number of interfaces 128-1 through 128-4, a microcontroller 40, and a central processing unit (CPU) 18. Of the interfaces 128, power monitor interface 128-1 connects to a power bus 13 to which the AC power 89 connects. Telephony interface 128-2 connects to a Plain Old Telephone System (POTS) 19 that in turn connects to a central station 138. Detection circuit interface 128-3 connects to detection circuit 84. Notification circuit 128-4 connects to a notification circuit 94.

The microcontroller 40 is preferably a self-contained computer system having one or more programmable interfaces, one or more analog to digital input ports, and one or more digital to analog output ports. It further has memory and one or more processors/processor cores.

According to the embodiment, the microcontroller 40 further stores one or more charging profiles 54 and has an Analog to Digital (A/D) converter 27. The microcontroller 40 also communicates with the CPU 18 and interfaces 128 of the panel 70. In examples, the microcontroller 40 handles monitoring for AC power 89, earth faults, manages the detection and notification circuits 84/94, reports fire alarm status to municipal fire departments via the telephony interface 128-2, reports to the CPU 18, and manages the flow of power through the fire control panel 70. Most of these are time-sensitive functions, especially the communication with the main system CPU 18.

The charging system 10 in conjunction with the microcontroller 40 provide the base set of features of traditional charging systems. The charging system 10 also does not compromise different aspects of its design as some traditional charging systems do.

The detection circuit 84 includes one or more fire detection/initiation devices 111-1 and 111-2 that detect an indication of fire such as heat, flame and/or smoke, and a pull station 85. The fire detection/initiation devices 111 send signals in response to detecting an indication of fire to the panel 70. The fire detection/initiation devices 111 send the signals via the detection circuit interface 128-3. When activated by an individual, the pull station 85 sends an emergency signal over the detection circuit 84 and the panel 70 receives the signal via its detection circuit interface 128-3 in a similar fashion.

The notification circuit 94 includes one or more notification devices 121. In response to receiving signals indicative of fire or an emergency condition from the detection circuit 84, the panel 70 sends signals over the notification circuit 94 to activate the notification devices 121 to alert occupants at the premises 90, such as activating a strobe alarm notification device 121-1 and a siren alarm notification device 121-2.

The backup battery system 32 includes one or more batteries and a temperature sensor 42 that measures a temperature 124 of the batteries. In one implementation, the temperature sensor 42 is a thermistor or other passive device. The microcontroller 40 reads a voltage across the thermistor via its A/D converter 27 at regular intervals, and the microcontroller 40 converts the detected voltages to a temperature 124. In another implementation, the microcontroller 40 obtains the temperature 124 by polling the temperature sensor 42, typically on the order of tenths of a second. In yet another implementation, the charging system 10 polls the temperature sensor 42 for the temperature measurement 124 and sends the temperature measurement 124 to the microcontroller 40.

The charging system 10 includes components such as a primary power source 20, an analog power converter 22, a current sensing circuit 30, an error amplifier 26, a voltage feedback loop 50 and a current feedback loop 60. The voltage feedback loop 50 controls the analog power converter 22 by comparing the output voltage versus a reference and adjusting the power converter 22 proportionally to the error. The current feedback loop 60 controls the analog power converter 22 by adjusting the maximum output current Iout. In one implementation, the various components of the charging system 10 are arranged on a printed circuit board (PCB) and are electrically connected via traces of the PCB. The traces are made of aluminum, copper or other electrically conductive material, in examples.

The current sensing circuit 30 is connected in series between the analog power converter 22 and the backup battery system 32. The analog power converter 22 connects to the current sensing circuit 30 via output connection 35. In one example, the output connection 35 is a printed circuit trace. The output current Iout at the output voltage Vout flows from the analog power converter 32 through the current sensing circuit 30. Iout then flows to the backup battery system 32 for charging the batteries of the backup battery system 32.

In many traditional charging system designs, the power converter is a one-way power converter that either steps up (boosts) or steps down (bucks) its primary power source to create the desired output voltage and output current. If the primary power source is at roughly the same voltage as the batteries of the backup battery system, a Buck/Boost converter can be used; however they are usually avoided due to cost and complexity. Buck and boost converters are typically created by using a transistor to connect and disconnect an energy storage element like an inductor into a rectified filtering network that averages this on-off action into a constant DC output. The output power is a function of the percentage of time each cycle that the transistor is on versus off in a method called Pulse Width Modulation. Switching power converters (as these are called) are designed to minimize the energy wasted to heat during the conversion of one voltage and current into another. Buck-style battery chargers can also be made using a 'linear' converter where the voltage difference between input and output is simply spent as waste heat; however, any battery charger with this level of complexity will almost certainly be a 'switching' converter.

The voltage feedback loops of traditional charging systems sample the output voltage provided by the analog power converter, using a proportional voltage created by a resistive voltage divider. A voltage divider is a passive linear circuit that includes two or more resistors in series, where the output voltage is a fixed fraction of its input voltage. However, because the voltage dividers have fixed resistance values, the analog power converters in the traditional charging systems make the same output.

Traditional charging systems also often support temperature compensation by using a temperature dependent resistor inside the voltage feedback loop. This has drawbacks, however. The temperature dependent resistor is located near the normally hot circuitry of the voltage feedback loop and power converter, rather than being remotely located with the batteries of the battery charging system. Moreover, the temperature dependent resistors usually have exponential response curves, while the voltage and current feedback loops are linear circuits.

Returning to FIG. 1A, a portion or all of the resistive voltage dividers of traditional charging systems are replaced with digital resistors in the charging system 10 of the proposed building management system 100. Digital resistors are digitally-controlled integrated circuits that generate an output resistance value in response to programmed input. The input is a resistor setting that is included within a message sent to the digital resistor. The voltage feedback loop 50 includes at least one output voltage digital resistor 24 and the output current feedback loop 60 includes at least one output current digital resistor 34.

In more detail, the voltage feedback loop 50 includes at least one output voltage digital resistor 24 that receives resistor settings 23 calculated by and sent from the microcontroller 40. The microcontroller 40 updates the resistor setting 23 to control the output voltage Vout. In response to receiving the resistor setting 23, the output voltage digital resistor 24 produces a resistance value that modifies the voltage feedback loop 50. The voltage feedback loop 50, in turn, adjusts the output voltage Vout. In one implementation, the output voltage digital resistor 24 is configured as a rheostat for adjusting the output voltage Vout.

The current feedback loop 60 includes a non-inverting operational amplifier (op amp) 48 and at least one output current digital resistor 34 that receives resistor settings 33 calculated by and sent from the microcontroller 40. Inputs of the op amp 48 connect to the current sensing circuit 30 and the output current digital resistor 34, and the output of the op amp 48 connects to the error amplifier 26. The microcontroller 40 updates the resistor setting 33 to control the gain of the current sensing circuit. By adjusting the gain of the op amp 48, the output current Iout can be adjusted to any level required.

Because the microcontroller 40 controls the charging system 10 by updating digital resistors 24/34 in the voltage and current feedback loops 50/60, respectively, the charging system 10 is also known as a software defined charging system.

Figure 1B:
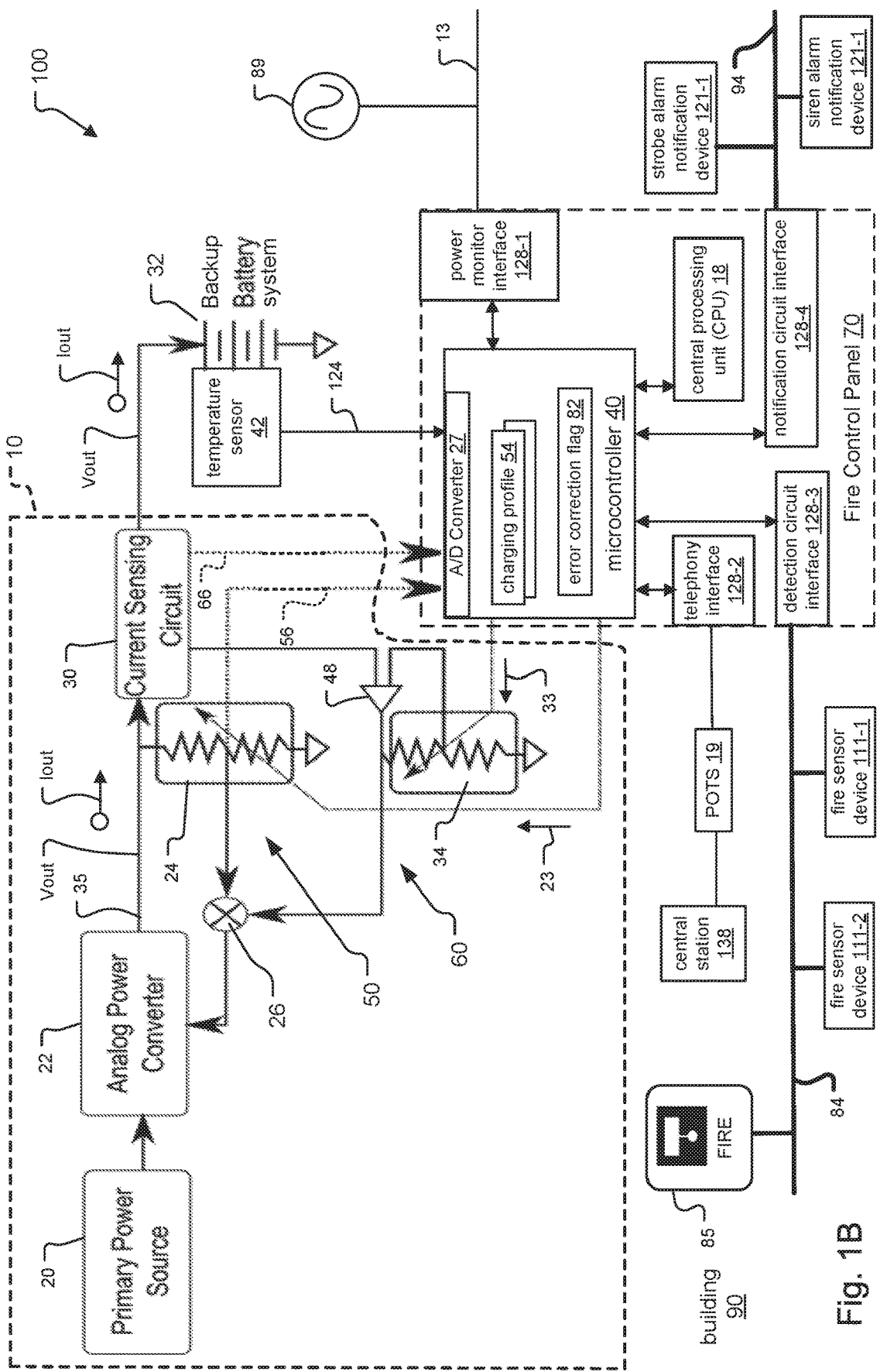
FIG. 1B shows another embodiment of a fire alarm system including a fire control panel as in FIG. 1A, where the microcontroller of the fire control panel also controls the operation of the charging system.

FIG. 1B also shows a fire alarm system 100. FIG. 1B includes all components as in FIG. 1A, and the fire alarm system 100 operates in a similar fashion as in FIG. 1A. However, the charging system 10 and the fire control panel 70 include additional features not found in FIG. 1A. In examples, the additional features include the ability to monitor the output current Iout and the output voltage Vout, and to adjust Iout and Vout for errors.

The voltage feedback loop 50 provides a sampled version of the output voltage Vout, indicated by reference 56. The current sensing circuit 30 provides a sampled version of the output current Iout, indicated by reference 66. The sampled output voltage 56 and sampled output current 66 are received by the A/D converter 27 of the microcontroller 40. In a preferred implementation, the charging system 10 provides the sampled output voltage 56 and sampled output current 66 on a periodic basis to the microcontroller 40. However, the microcontroller 40 can also poll the charging system 10 for these values. The microcontroller 40 uses the sampled output voltage 56 and sampled output current 66 to adjust for errors in the output voltage Vout and output current Iout. In this way, the charging system 10 of FIG. 1B can measure errors in the output voltage Vout and output current Iout, and correct these errors.

In one implementation, the microcontroller 40 receives an error correction flag 82 sent from a user on a computer system. The error correction flag 82 normally has a value of false. Possible sources of error that can cause the error correction flag 82 to have a value of true include: resistors with inconsistent values in production, and losses through other components, traces, cables, or connectors, in examples. Based upon the value of the flag 82 (e.g. true or false), the microcontroller 40 can modify its operation to select between the functionality for controlling the charging system 10 of the fire alarm system 100 of FIG. 1A (when the flag 82 is false) and for the charging system 10 of the fire alarm system 100 of FIG. 1B (when the flag 82 is true).

FIG. 2 includes an exemplary charging profile 54 included within/stored by the microcontroller 40 for the charging system 10. The microcontroller 40 applies charging profiles 54 to the backup battery system 32 for charging batteries in the backup battery system 32.

Backup battery systems 32 preferably include batteries of the same size and battery chemistry. The microcontroller 40 maintains a separate charging profile 54 for each size and battery chemistry supported by the charging system 10, i.e. for each backup battery system 32 having specific battery size and battery chemistry requirements.

Each charging profile 54 includes a battery ID 102, a target voltage 122, a target current 132, a charging mode 104 and a temperature compensation table 146. The battery ID 102 is associated with the specific battery size and chemistry of batteries in each battery backup system 32 that the charging system 10 supports. The target voltage 122 defines a value for the output voltage Vout that the analog power converter 22 applies to the backup battery system 32, while the target current 132 defines a maximum value for the output current Iout that the analog power converter 22 can apply to the backup battery system 32. The target voltage 122 is based on chemistry of the batteries within the backup battery system 32 and the charging mode 104. The target current 132 is based on a size of the batteries (e.g. number of cells) and the charging mode 104.

The charging mode 104 is a field that indicates the current mode for charging the backup battery system 32. Fast charge and float charging modes are typically supported. Fast charging mode selects a higher value for the target voltage 122, for faster charging of the batteries of the backup battery system 32. In contrast, float charging mode selects a lower value for the target voltage 122, for maintaining fully charged batteries for extended lifetimes. In one example, an operator can configure the charging mode 104.

The microcontroller 40 receives a temperature 124 measured by and sent from a temperature sensor 42 of the backup battery system 32, and maintains a temperature compensation table 146. The temperature compensation table 146 incorporates data of temperature compensation curves for the supported size and battery chemistry of the batteries. A temperature compensation table 146 is typically included within each charging profile 54. The table 146 provides a temperature compensation voltage 126 for adjusting the output voltage Vout, based upon the temperature 124 of the batteries in the backup battery system 32 and the target voltage 122.

Figure 3:
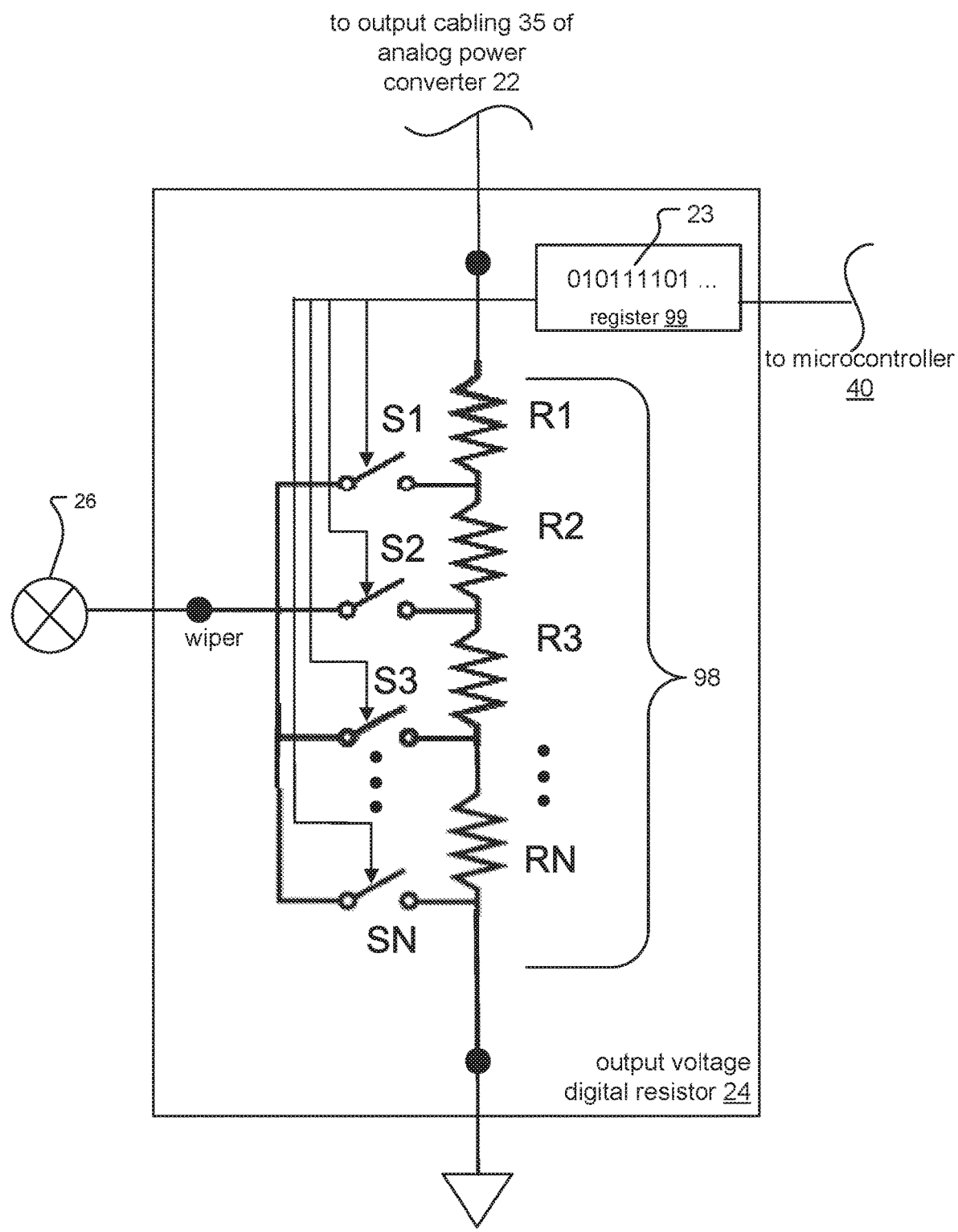
FIG. 3 and FIG. 4 are exemplary configurations of an output voltage digital resistor and an output current digital resistor within the charging systems included in FIGS. 1A and 1B.

FIG. 3 shows detail for an output voltage digital resistor 24 of the voltage feedback loop 50 in the charging systems 10 in FIGS. 1A and 1B. The output voltage digital resistor 24 includes a register 99.

Output voltage digital resistor 24 includes a few or many resistors R1 . . . RN that form a series chain of resistors, and includes a series of switches S1 . . . SN. The series chain of resistors is also known as a resistor ladder 98. Each switch SN controls an individual resistor RN. In one example, the resistor setting 23 specifies an on/off switch setting for each of the switches S1 . . . SN. When a switch SN is set to its "on" setting, the corresponding resistor RN is connected to the resistor ladder 98.

When the digital resistor 24 receives an updated resistor setting 23 from the microcontroller 40, the digital resistor 24 stores the resistor setting 23 to its register 99. The digital resistor 24 then configures its resistor ladder according to the configuration of the switches indicated by the resistor setting 23.

Within the voltage feedback loop 50, the output voltage digital resistor 24 provides a resistance value that modifies the resistance of the voltage feedback loop 50. This, in turn, adjusts the output voltage Vout.

The output voltage digital resistor 24 can be configured as a potentiometer or rheostat, based upon how the output voltage digital resistor 24 is connected to the charging system 10. Here, the output voltage digital resistor 24 is connected to the output cabling 35 of the analog power converter 22 and the error amplifier 26 of the charging system 10.

If the output connector 35 of the analog power converter 22 is connected to one of the ends of the chain of resistors in the output voltage digital resistor 24, the digital resistor 24 is configured as a variable resistor, sometimes called a rheostat. If instead the output cabling 35 is connected as a 3rd terminal of the chain (e.g. the wiper) and the other end is connected to ground, as in FIG. 3, a proportional voltage between the two ends of the chain results and this is called a potentiometer. The wiper of the output voltage digital resistor 24 is connected to the error amplifier 26 of the charging system 10.

Figure 4:
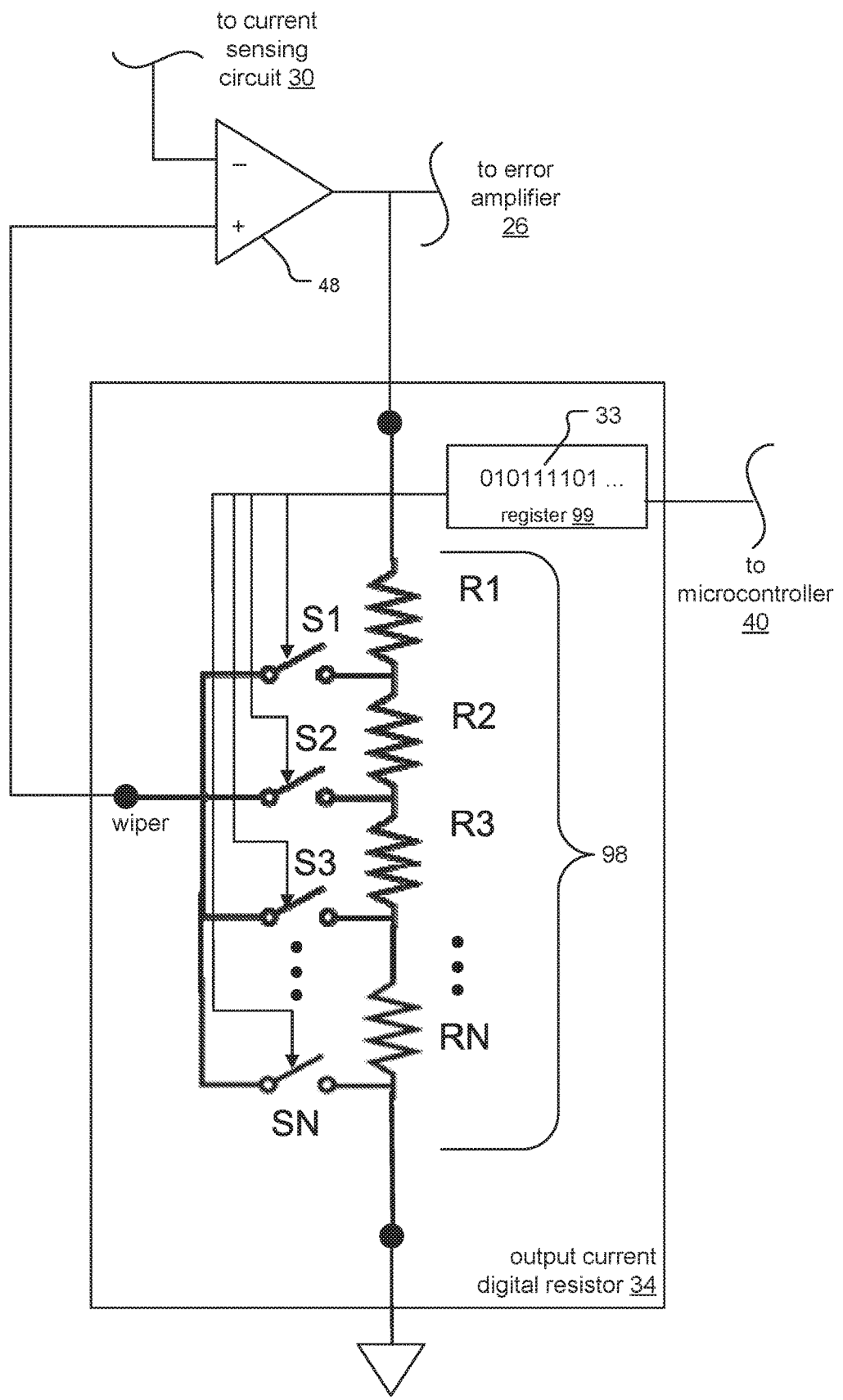

FIG. 4 shows detail for an output current digital resistor 34 of the current feedback loop 60 in the charging systems 10 in FIGS. 1A and 1B. The output current digital resistor 34 includes a register 99 that is updated by the microcontroller 40 with a resistor setting 33 and functions in a substantially similar way as the output voltage digital resistor 24 in FIG. 3.

As with the output voltage digital resistor 24 in FIG. 3, the output current digital resistor 34 can be configured as a potentiometer or rheostat, based upon how the output current digital resistor 34 is connected to the charging system 10. Here, the output current digital resistor 34 is connected to the non-inverting op amp 48 of the charging system 10. In FIG. 4, for example, the output voltage digital resistor 34 is configured as a potentiometer, where a non-grounded end of the output current digital resistor 34 is connected to a negative terminal of the op amp 48 and a wiper of the output current digital resistor 34 is connected to a negative terminal of the op amp 48.

Within the current feedback loop 60, the output current digital resistor 34 provides a resistance value that modifies the gain of the current feedback loop 60. This, in turn, adjusts the output current Iout.

Figure 5:
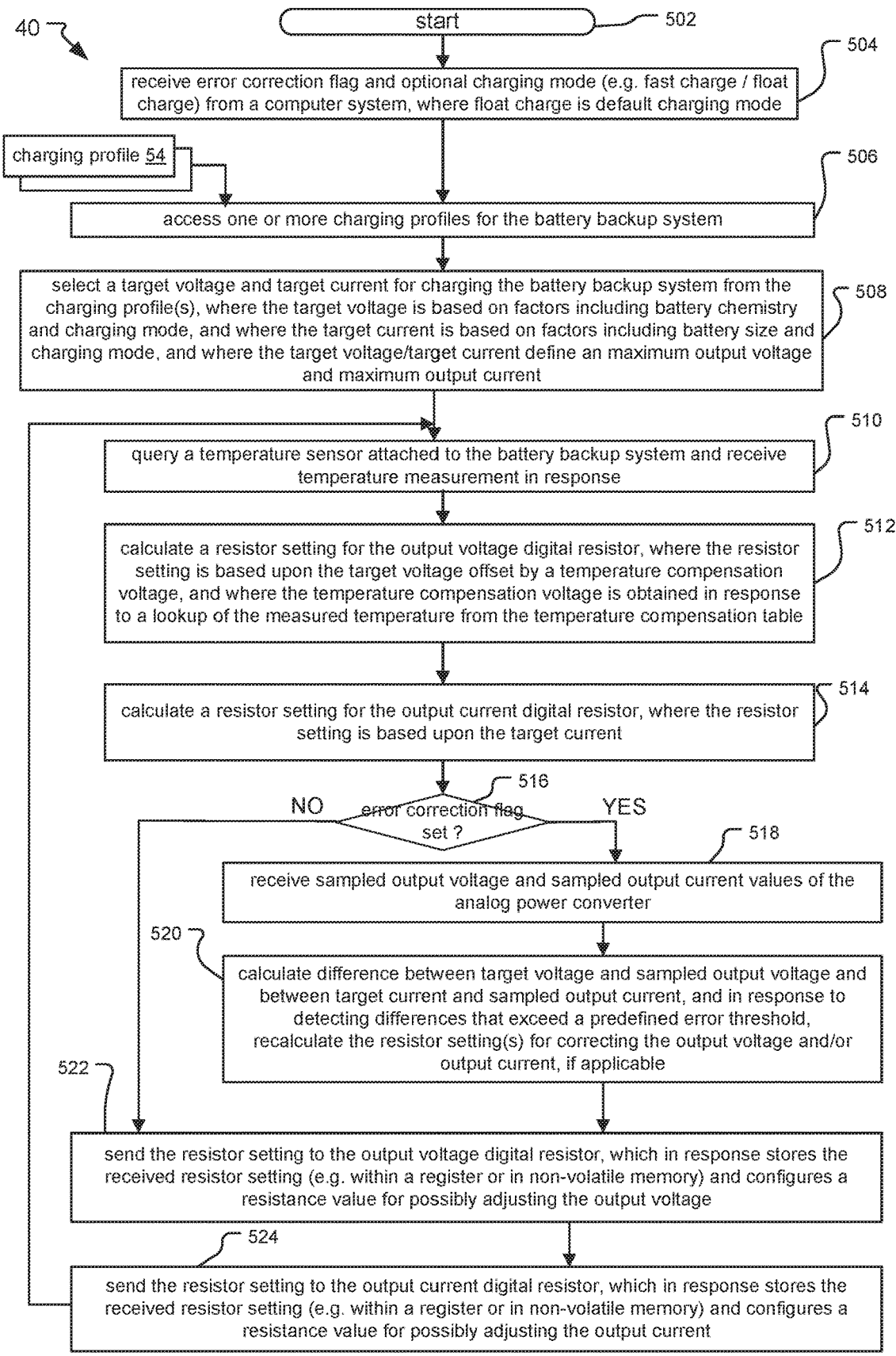
FIG. 5 is a flow chart that describes a method of operation for the microcontroller for controlling an analog power converter of the charging system in FIGS. 1A and 1B.

FIG. 5 is an exemplary method of operation for the microcontroller 40 of the fire control panel 70 in the fire alarm systems 100 of FIGS. 1A and 1B. The method starts at step 502.

In step 504, the microcontroller 40 receives an error correction flag 82 and optional charging mode 104 (e.g. fast charge/float charge) from an operator on a computer system. Float charge is the default charging mode. In one implementation, the value of the error correction flag 82 (e.g. true or false) is a mechanism for an operator to select between the capabilities provided by the charging systems 10 of FIG. 1A (false) and FIG. 1B (true).

Additionally and/or alternatively, in another example, the microcontroller 40 can change the state of the error correction flag 82 in response to the available and/or current use of resources in the microcontroller 40. For example, the microcontroller 40 can set the value of the error correction flag 82 to false in order to conserve resources. Such a feature is useful when the microcontroller 40 is especially busy executing other higher priority tasks, such as receiving and processing indications of fire sent from multiple fire sensor devices 111 during an active emergency, in one example.

According to step 506, the microcontroller 40 accesses one or more charging profiles 64 for the battery backup system 32 and determines a charging profile 54 that is appropriate based on the battery backup system 32. In step 508, the microcontroller 40 selects a target voltage 122 and target current for 132 charging the battery backup system 32 from the charging profile(s) 54, where the target voltage 122 is based on factors including battery chemistry and charging mode 104, and where the target current 132 is based on factors including battery size and charging mode 104. The target voltage/target current 122/132 define a maximum value for the output voltage Vout and maximum value for the output current Iout, respectively.

Then, in step 510, the microcontroller 40 queries a temperature sensor 42 such as a thermistor attached to batteries of the battery backup system 32 and receives a temperature measurement 124 in response. Alternatively, the charging system 10 can periodically obtain the temperature 124 of the batteries in the battery backup system 32 by polling the temperate sensor 42 and sending the temperature measurement 124 to the microcontroller 40.

In step 512, the microcontroller 40 calculates a resistor setting 23 for the output voltage digital resistor 24, where the resistor setting 23 is based upon the target voltage 122 offset by a temperature compensation voltage 126. The temperature compensation voltage 126 is preferably obtained in response to the microcontroller 40 executing a lookup of the measured temperature 124 from the temperature compensation table 146 maintained by the microcontroller 40 within the charging profile 54.

In step 514, the microcontroller 40 calculates a resistor setting 33 for the output current digital resistor 34, where the resistor setting 33 is based upon the target current 132 in the selected charging profile 54. In step 516, the microcontroller 40 determines whether the error correction flag 82 is set. If the error correction flag 82 is not set (e.g. is false), which corresponds to the charging system 10 of FIG. 1A, the method transitions to step 522. If the error correction flag 82 is set (e.g. is true), which corresponds to the charging system 10 of FIG. 1B, the method transitions to step 518.

In step 518, the microcontroller 40 receives the sampled output voltage 56 and sampled output current 66 of the analog power converter 22 from the charging system 10 of FIG. 1B. Then, in step 520, the microcontroller 40 calculates a difference between the target voltage 122 and sampled output voltage 56 and a difference between the target current 132 and sampled output current 66. In response to detecting differences that exceed a predefined error threshold, the microcontroller 40 can then recalculate the resistor setting(s) 23/33 for correcting the output voltage Vout and/or output current Iout. The method then transitions to step 522.

In step 522, the microcontroller sends resistor setting 23 to the output voltage digital resistor 24 to update its register 99. The output voltage digital resistor 24, in response, stores the received resistor setting 23 (e.g. within the register 99 or in non-volatile memory) and configures a resistance value for possibly adjusting the output voltage Vout.

According to step 524, the microcontroller sends resistor setting 33 to the output current digital resistor 34 to update its register 99. The output current digital resistor 34, in response, stores the received resistor setting 33 (e.g. within the register 99 or in non-volatile memory) and configures a resistance value for possibly adjusting the output current Iout. Upon completion of step 524, the method transitions to the beginning of step 510, which enables the microcontroller 40 to continue its control of the analog power converter 22.

It is important to note that the amount of resources that the microcontroller 40 uses for controlling the charging system 10 is negligible compared to the amount of resources that the microcontroller 40 typically uses to monitor and control other components of the building management system 100. In one example, the microcontroller 40 typically polls the power bus 13 on the order of tens of milliseconds to detect potential power disruptions. In contrast, the microcontroller 40 typically executes the tasks associated with controlling the charging system 10 on the order of once a second or slower.

While this invention has been particularly shown and described with references to preferred embodiments thereof, it will be understood by those skilled in the art that various changes in form and details may be made therein without departing from the scope of the invention encompassed by the appended claims.

What is claimed is:

1. A power system, comprising:
a backup battery system;
a microcontroller; and
a charging system for charging the backup battery system, including an analog power converter that provides an output current at an output voltage to the backup battery system under control of the microcontroller, wherein the microcontroller controls the output voltage by updating a voltage register within an output voltage digital resistor of a voltage feedback loop of the charging system.

2. The system of claim 1, wherein the microcontroller stores one or more charging profiles for the charging system to apply to the backup battery system for charging the backup battery system, and wherein the charging profiles include:

a target voltage, and a target current for defining a maximum output current; and a temperature compensation table that provides a temperature compensation voltage based upon a temperature of batteries in the backup battery system.

3. The system of claim 2, wherein the target voltage within each charging profile is based on chemistry of the batteries within the backup battery system.

4. The system of claim 2, wherein the target current within each charging profile is based on a size of the batteries within the backup battery system.

5. The system of claim 1, wherein the microcontroller controls the output current by updating a current register within an output current digital resistor of a current feedback loop of the charging system.

6. The system of claim 1, wherein the microcontroller receives a temperature measurement of the backup battery system, obtains a temperature compensation voltage based upon the measured temperature, and updates the register based upon the temperature compensation voltage.

7. The system of claim 6, wherein the microcontroller receives the temperature measurement from a temperature sensor located within the backup battery system.

8. A power system, comprising:
a backup battery system;
a microcontroller; and
a charging system for charging the backup battery system, including an analog power converter that provides an output current at an output voltage to the backup battery system under control of the microcontroller,
wherein the microcontroller controls the output current by updating a register within an output current digital resistor of a current feedback loop of the charging system.

9. A method for providing backup power, comprising:
a backup battery system powering backup power;
a charging system charging the backup battery system; and
at least one microcontroller controlling an analog power converter of the charging system to provide an output current at an output voltage to the backup battery system by the microcontroller updating a register within an output voltage digital resistor of a voltage feedback loop of the charging system.

10. The method of claim 9, further comprising the charging system measuring errors in the output voltage and/or output current, and correcting the errors.

11. The method of claim 9, further comprising storing one or more charging profiles for the backup battery system, the one or more charging profiles including a target current based on a size of batteries within the backup battery system, the target current defining a maximum value for the output current.

12. The method of claim 9, further comprising the at least one microcontroller:
monitoring a power bus that provides a primary source of input power to a life safety system; and
sending notifications to a central station in response to receiving indications of a life safety event.

13. The method of claim 9, wherein the at least one microcontroller controlling the analog power converter of the charging system to provide the output current at the output voltage to the backup battery system further comprises:
receiving a temperature measurement of the backup battery system;
obtaining a temperature compensation voltage based upon the measured temperature and a target voltage maintained by the microcontroller, and
updating the register within the output voltage digital resistor with a resistor setting, the resistor setting being based upon the target voltage offset by the temperature compensation voltage.

14. The method of claim 13, further comprising the microcontroller obtaining the temperature compensation voltage in response to the microcontroller executing a lookup of the measured temperature from a temperature compensation table maintained by the microcontroller.

15. The method of claim 13, wherein the at least one microcontroller controlling the analog power converter of the charging system to provide the output current at the output voltage to the backup battery system comprises the microcontroller updating a current register within an output current digital resistor of a current feedback loop of the charging system.

16. A method for providing backup power, comprising:
a backup battery system powering backup power;
a charging system charging the backup battery system; and
at least one microcontroller controlling an analog power converter of the charging system to provide an output current at an output voltage to the backup battery system by the microcontroller updating a register within an output current digital resistor of a current feedback loop of the charging system.

17. The method of claim 16, further comprising the microcontroller calculating a resistor setting based on a target current maintained by the microcontroller, the target current defining a maximum value for the output current; and updating the output current digital resistor with the resistor setting.

* * * * *